US008010856B2

(12) United States Patent
Cannon et al.

(10) Patent No.: US 8,010,856 B2
(45) Date of Patent: Aug. 30, 2011

(54) METHODS FOR ANALYZING SCAN CHAINS, AND FOR DETERMINING NUMBERS OR LOCATIONS OF HOLD TIME FAULTS IN SCAN CHAINS

(75) Inventors: Stephen A. Cannon, Fremont, CA (US); Richard C. Dokken, San Ramon, CA (US); Alfred L. Crouch, Cedar Park, TX (US); Gary A. Winblad, Dublin, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 520 days.

(21) Appl. No.: 12/058,768

(22) Filed: Mar. 31, 2008

(65) Prior Publication Data

US 2009/0113263 A1    Apr. 30, 2009

Related U.S. Application Data

(63) Continuation-in-part of application No. 11/931,847, filed on Oct. 31, 2007.

(51) Int. Cl.
*G01R 31/28* (2006.01)

(52) U.S. Cl. ........ 714/726; 714/727; 714/728; 714/729; 714/730; 714/731

(58) Field of Classification Search ................ None
See application file for complete search history.

(56) References Cited

U.S. PATENT DOCUMENTS

| | | | |
|---|---|---|---|
| 3,783,254 A | 1/1974 | Eichelberger | |
| 4,293,919 A | 10/1981 | Dasgupta et al. | |
| 6,516,432 B1 | 2/2003 | Motika et al. | |
| 6,584,591 B1 * | 6/2003 | Taylor | 714/731 |
| 7,058,869 B2 * | 6/2006 | Abdel-Hafez et al. | 714/729 |
| 7,107,502 B2 * | 9/2006 | Burdine | 714/726 |
| 7,225,374 B2 | 5/2007 | Burdine et al. | |
| 7,234,090 B2 | 6/2007 | Blasi et al. | |
| 7,395,470 B2 | 7/2008 | Burdine et al. | |
| 2005/0172188 A1 * | 8/2005 | Burdine | 714/726 |
| 2005/0235186 A1 | 10/2005 | Wang et al. | |
| 2007/0220381 A1 * | 9/2007 | Huang et al. | 714/724 |
| 2008/0040637 A1 | 2/2008 | Huang et al. | |
| 2008/0141085 A1 | 6/2008 | Dokken et al. | |
| 2008/0250284 A1 | 10/2008 | Guo et al. | |

OTHER PUBLICATIONS

U.S. Appl. No. 11/931,847, filed Oct. 31, 2007, Cannon, et al.

(Continued)

*Primary Examiner* — Jeffrey A Gaffin
*Assistant Examiner* — Guerrier Merant
(74) *Attorney, Agent, or Firm* — Holland & Hart, LLP

(57) ABSTRACT

In a method for determining a number of possible hold time faults in a scan chain of a DUT, an environmental variable of the scan chain is set to a value believed to cause a hold time fault in the scan chain, and then a pattern is shifted through the scan chain. The pattern has a background pattern of at least n contiguous bits of a first logic state, followed by at least one bit of a second logic state, where n is a length of the scan chain. The number of possible hold time faults in the scan chain can be determined as a difference between i) a clock cycle when the at least one bit is expected to cause a transition at an output of the scan chain, and ii) a clock cycle when the at least one bit actually causes a transition at the output of the scan chain. If a value of the environmental variable at which the scan chain operates correctly can be determined, the location of one or more hold time faults can also be determined.

23 Claims, 8 Drawing Sheets

OTHER PUBLICATIONS

International Search Report and Written Opinion for International Application No. PCT/US08/82088 mailed on Feb. 13, 2009.
Storey, T.M, et al., "Delay Test Simulation", IBM System Products Division, East Fishkill, Hopewell Junction, New York, 12533, pp. 492-494.

* cited by examiner

First Bit Out    Last Bit Out
                                ↓              ↓
Expected Pattern Data:   00110011
Actual DUT Data:         0110011X
Pass/Fail Signature:     PFPFPFPX

FIG. 1

First Bit Out    Last Bit Out
                                ↓              ↓
Expected Pattern Data:   00110011
Actual DUT Data:         0010001X
Pass/Fail Signature:     PPPFPPPX

FIG. 2

METHODS FOR ANALYZING SCAN CHAINS, AND FOR DETERMINING NUMBERS OR LOCATIONS OF HOLD TIME FAULTS IN SCAN CHAINS

CROSS-REFERENCE TO RELATED APPLICATION

This application is a continuation-in-part of application Ser. No. 11/931,847, filed Oct. 31, 2007, which application is hereby incorporated by reference.

BACKGROUND

As technology nodes shrink, more defects are found in the scan chains that are added to a device for the purpose of test. This is due to a number of reasons, as described in this document. To bring new integrated circuits to market, and to ramp yield to acceptable levels, new methods and apparatus are needed to identify scan chain defects.

Scan chains are critical items for test and yield-bring-up. When they break, they both relegate a device (e.g., a chip) under test to the fail bin (adding to the yield loss problem) and they mask and prevent timely and accurate evaluation of other fails sourcing from combinational, sequential, power-distribution or clock logic.

The approach of design for test (DFT) or scan methodology is to replace all flip-flops in a design with scan flip-flops. Scan flip-flops (or scan cells) provide two paths into each flip-flop: one path for the mission of the design, and a second path to facilitate test.

The two most common approaches to scan flip-flops are the MUXD and LSSD approaches. The MUXE approach places a multiplexer (mux) on the front end of the D-input of a flip-flop. The selector to the mux, known as the scan enable, determines whether to use the mission mode input or the scan test input of the mux. The LSSD approach uses multiple non-overlapping clocks: one pair of which operates separated Master and Slave latches for propagating mission data; and the other pair of which operates the separated Master and Slave latches to produce a scan shift operation. With the LLSD approach, the total scan shift and sample operation may be conducted with just one pair of clocks or with a combination of all of the clocks.

By stitching the scan flip-flops (or scan cells) of a DUT into one or more shift registers called scan chains, each flip-flop can be preset or observed. This allows for test patterns to be constructed that will concentrate on finding faults in sub-circuits of the DUT.

Further descriptive commentary will focus on the MUXD type scan, since it is easier and simpler to describe. In a MUXE type scan, each scan flip-flop has two input paths, controlled by a mux at the flip-flop's D-input. When the scan enable is asserted, the scan chain operates as a shift register. This allows for each flip-flop to be set to a specific state. It also allows for the observation of each flip-flop state as the values are shifted out of the device onto the scan output. Level Sensitive Scan Design is disclosed by Storey et al., "Delay Test Simulation", 14th Design Automation Conference Proceedings, pp. 492-494 (June 1977), and in U.S. Pat. Nos. 3,783,254 and 4,293,919.

There are several generally accepted models for defects (or faults) in scan chains: blocked chains, bridging, and hold time.

Blocked Chains—This condition is determined by observing the scan outputs while in scan mode. If the output is at a fixed level regardless of the data shifted into the chain, the chain is blocked at one or more points, and the block nearest to the scan output dominates what is observed from that chain. The fault model is generally that the output of the scan chain is either stuck-at-0 or stuck-at-1 from the sequential element located at the point of the block.

Bridging—Bridging faults are a condition of data dependency when data passing through one scan chain can modify data in another scan chain or in a different location in the same scan chain. The suspected mechanism is an "aggressor-victim" short or bridge that is exercised when the two signals involved are at opposite values.

Hold Time—Hold time faults are a condition that allows the data from one flip-flop to race forward in the chain. Hold time faults are attributed to a number of factors, including long wire routes as compared to Clock-to-Q times of flip-flops and clock skew. This condition is suspected when data produced on the output is still toggling but seems skewed (correct response but shifted in time) or when bits are missing (data smearing or bit skipping). Overall, hold time faults can be viewed as "accidental encryption". If the number of bits applied at the scan input does not match the data on the scan output, it is likely that a hold time fault exists. In some cases, hold time faults make the scan chain appear to have fewer flip-flops than it actually has.

Hold time is a data communication fault between two adjacent cells in a scan chain, where the bit closest to the scan input is the aggressor cell and the bit closest to the scan output is the victim cell. When a hold time fault exists, the victim cell's data value is replaced with the aggressor cell's data value. The resultant data stream shows the aggressor's data twice, and the victim's data is lost. There are three common types of hold time fault.

Standard hold time fault—When both data states (aggressor and victim) are improperly communicated, a fail signature results that simulates a missing flip-flop in the scan chain.

Data One hold time fault—When the aggressor cell's data is a logic one, its data is pulled forward one location, overwriting the victim's data. The resultant fail signature has too many ones.

Data Zero hold time fault—When the aggressor cell's data is a zero, its data is pulled forward one location, overwriting the victim's data. The resultant fail signature has too many zeros.

Typically, to insure that the scan chain test logic is operational, tests will be performed on the scan chain test logic prior to performing tests of a device's functional logic. These tests on the scan chain test logic are commonly known as Scan Chain Integrity Tests. The most common approach is to send a series of 1's and 0's at the scan inputs. With the scan enable asserted, the scan chain is essentially a big shift register. With the continued assertion of the scan enable, the functional logic is removed from the test. After 'n' number of clock cycles, where 'n' equals the number of scan cells in the chain, the input stream should be observed on the scan output if the scan chain operates correctly.

If the scan chain does not transfer data from a scan input to a scan output reliably, the entire scan methodology is lost. Input data to load the chain and output data to unload the chain are both disrupted. This typically manifests itself as a scan chain integrity failure. This makes the scan chain appear to be shorter than it actually is by at least one flop. The clock skew issue can be caused by design issues such as timing closure, or manufacturing defects such as faulty vias or weak clock-tree buffers. In nanometer geometries, it is often caused by a combination of the two, causing a yield loss due to hold time issues.

Conventional chain integrity patterns produced by ATPG tools today are implemented as a replicated stream of a '0-0-1-1-0-0-1-1' sequence. This sequence has data changing on every other vector. Therefore, a device with a standard hold time fault appears to be shifted by one bit, and the last bit is indeterminate. The last bit that is shifted out is not part of the pattern; it is the state that was on the scan in pin when the scan out sequence was applied. See FIG. 1. Note that the fail signature with a single standard hold time fault is basically pass-fail-pass-fail.

Often, hold time faults are timing sensitive. That is, since the rise time and fall time of a flip-flop's Q output are not symmetrical, a hold time fault may result in an ability of the flip-flop to transfer one data state but not the other. This failure could be caused by the Q-output having a slower rise time than fall time.

The example shown in FIG. 2 assumes a single hold time fault, with "0" being the aggressor state and "1" being the victim state. When devices have multiple hold time faults on a single chain, the data shifts one cycle for each fault. It is quite common for smaller geometry devices to have multiple hold time faults on a single chain. With the standard 00110011 pattern, it is possible for a chain to shift the data 4 positions, and at the end of the pattern actually be passing the scan chain test.

As previously mentioned, in design for test methodology, flip-flops have a dual functionality. During normal or functional mode, they latch data states in the circuit and store values to be transmitted to the next cloud of logic in the design. During test mode, they are used to provide test stimuli to the combinational logic, and to capture the results of the logic operation. To transfer test patterns into and out of a device under test, the flip-flops are reconfigured as one or more serial shift registers.

A type of design problem known as a setup violation can occur if the amount of logic between two banks of registers is so great that the data does not propagate through the logic and become stable at the input to a flip-flop within the setup time allowed before a scan chain is clocked. When this occurs, the result that is clocked into a flip-flop may be invalid. This is solved by design methodologies and tools associated with the term "timing analysis".

After a desired scan pattern is loaded into one or more scan chains, scan enable is not asserted and the logic of a device is clocked one or more times in mission mode. The result of the logic operation is captured in the device's scan flip-flops. It is desirable to bring this result out of the device under test so that it can be examined by a test system. This is done by putting flip-flops back into serial shift mode, and then applying enough clocks to shift every bit in a number of scan chain(s) out of the scan out port(s). Most designs have some scan chains that are longer than others, so it is important to shift the data enough times for even the longest scan chain to be fully unloaded. Shorter chains are over shifted and therefore get padded with X (don't care) states. This same technique is applied when data is shifted in, where shorter chains are typically pre-padded with dummy "0" data before the actual data stream. At this time, it is common to shift a new test pattern in through the scan in port.

In conventional implementations of scan registers, charge flow or current is required to establish a clock event as well as a state change. A defect in the conductive medium of a device may lower the rate of current so that a state change or clock event may be delayed from its desired time. Furthermore clock signals must be distributed throughout a chip and require buffers to boost current. Any two clock signals may have a difference in arrival at their register, which is called clock skew, and which can be managed by adjusting the buffer size and the routing of the wires carrying the clock signal.

As an example of the effect of a hold time fault, consider a scan chain of length 8 (i.e., 8 bit positions, flip-flops or scan cells), with bit zero (0) closest to the scan out port and bit seven (7) closest to the scan in port. After a functional clock, the state of a device's logic is entirely captured within the scan chain's eight registers, as follows:

V(0) V(1) V(2) V(3) V(4) V(5) V(6) V(7)

In a correct shift register, each of the eight bits is serially shifted out, and a new test pattern beginning with I(0) is shifted in. But, imagine that bit six (6) exhibits a hold time fault. On the first shift clock, V(0) is emitted from the scan out port. However, the fault at bit six (6) causes it to capture V(7) rather than V(6) during this first shift. After eight shift clocks have been applied, the pattern captured at the scan out will be:

V(0) V(1) V(2) V(3) V(4) V(5) V(7) I(0)

Also, consider the above scan chain's corruption of an input test pattern, which might appear as:

I(0) I(1) I(2) I(3) I(4) I(5) I(7) I(N)

It may be appreciated that scan chains may be conventionally comprised of 10,000 registers (i.e., flip-flops or cells), and that even if less than 1 percent exhibit a hold time fault, hundreds of bits in a scan chain may be invalidated.

BRIEF DESCRIPTION OF THE DRAWINGS

Illustrative embodiments of the invention are illustrated in the drawings, in which:

FIG. 1 illustrates a first exemplary hold time fault;

FIG. 2 illustrates a second exemplary hold time fault;

Figure 3:
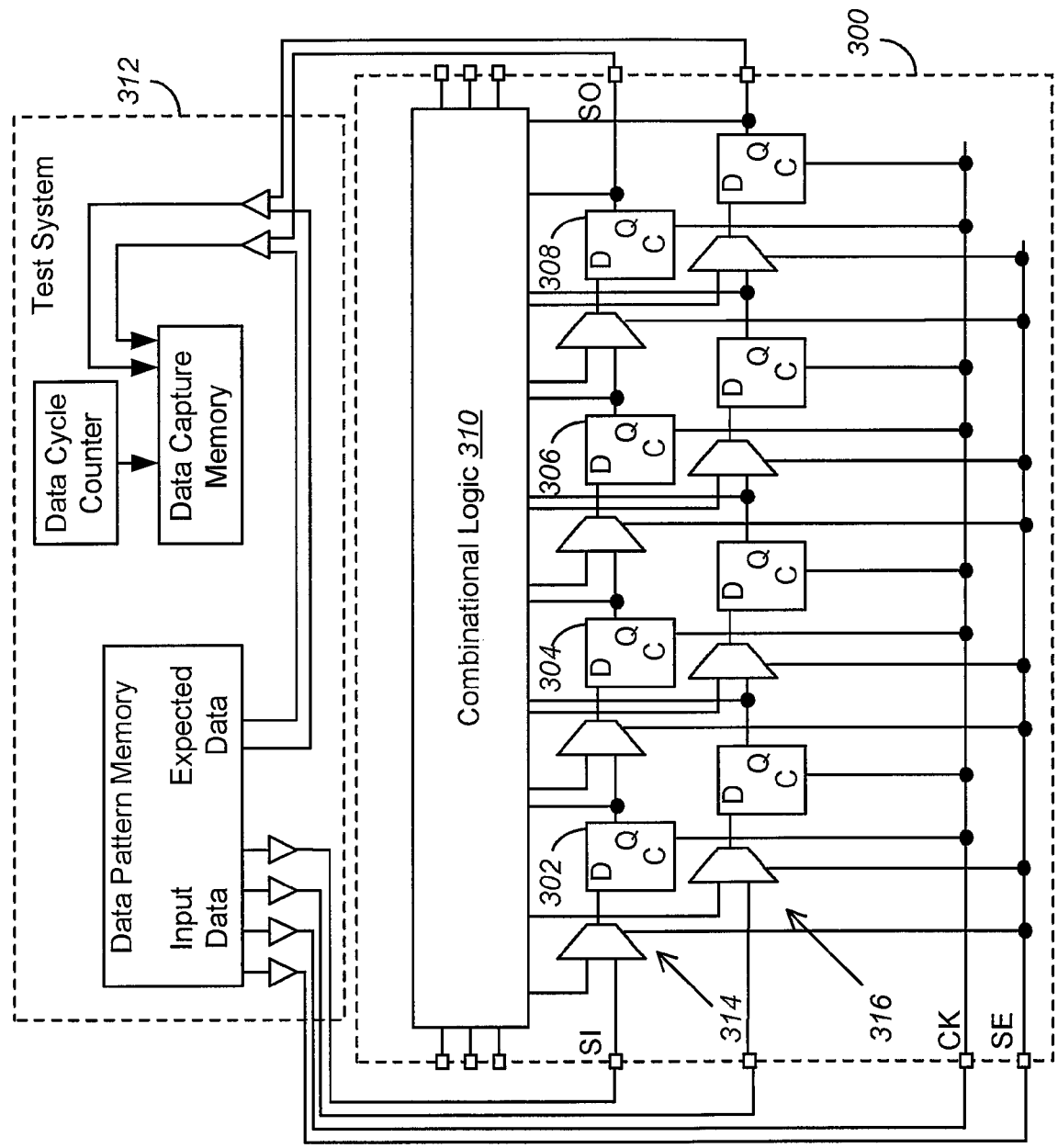
FIG. 3 illustrates an exemplary test system coupled to an exemplary device under test.

It is noted that, in the following description, like reference numbers appearing in different drawing figures refer to like elements/features. Often, therefore, like elements/features that appear in different drawing figures will not be described in detail with respect to each of the drawing figures.

DETAILED DESCRIPTION

Before describing a plurality of novel methods for determining the numbers or locations of hold time faults in one or more scan chains, an exemplary device under test 300, scan chains 314, 316 and test system 312 will be disclosed.

FIG. 3 illustrates an exemplary circuit 300 (or device under test (DUT)) comprising two scan chains 314, 316, a first of which comprises a series of four flip-flops 302, 304, 306, 308 that are interconnected with the combinational logic 310 of the circuit 300. The combinational logic 310 is enclosed in a "black box" for simplicity. By way of example, each scan chain 314, 316 is created by adding a signal multiplexer before the data input (D) of a corresponding flip-flop 302, 304, 306, 308. A single control signal called Scan Enable (SE) is added to control the selection of these multiplexers. Alternately, the scan chains 314, 316 could also be created in other ways, such as with LSSD technology. When the SE signal is low, the circuit 300 works as normal, meaning the data input to the flip-flops 302, 304, 306, 308 comes from the combinational logic 310. When the SE signal is high, the input of each flip-flop 302, 304, 306, 308 is connected to the output of another flip-flop or to an external scan out (SO) pin of the circuit 300. The data input to the first flip-flop 302 in the scan chain is also brought out to an external pin (i.e., a Scan In (SI) pin) of the circuit 300. After a test (or analysis) pattern is shifted into the scan chain 314, the SE signal is brought low for one cycle, and the data outputs of the combinational logic 310 resulting from the shifted in test pattern are captured in the flip-flops 302, 304, 306, 308. The SE signal is then brought back high and the captured data results are shifted out of the SO pin and compared against expected results by the test system 312. Any operational defect in the combinational logic 310 will cause one or more bits of the data output sequence to differ from the expected results.

The exemplary test system 312 is capable of carrying out structural tests (also known as scan tests or DFT tests) of the device 300, and in some cases may be capable of carrying out functional tests of the circuit 300. A Data Pattern Memory is loaded with the test patterns to be applied to, and the data patterns expected to be read from, the device 300. The test system 300 may have a selectable mode, for either 1) terminating the test whenever an error occurs (e.g., when an output data state differs from an expected data state), or 2) completing the entire pattern set and recording all of the errors that are observed. To accomplish this, a test system needs to have a Data Capture Memory. This memory may record the data cycle count and output pin for which an error is observed. Another mode of the Data Capture Memory is to record the raw (actual) states read from the scan outputs of the device 300.

FIGS. 4-9 illustrate various exemplary methods 400, 500, 600, 700, 800, 900 for analyzing a scan chain of a device under test (DUT). The methods are particularly tailored to the analysis of a scan chain for hold time faults, but may also be used to analyze a scan chain for other types of faults.

Figure 4:
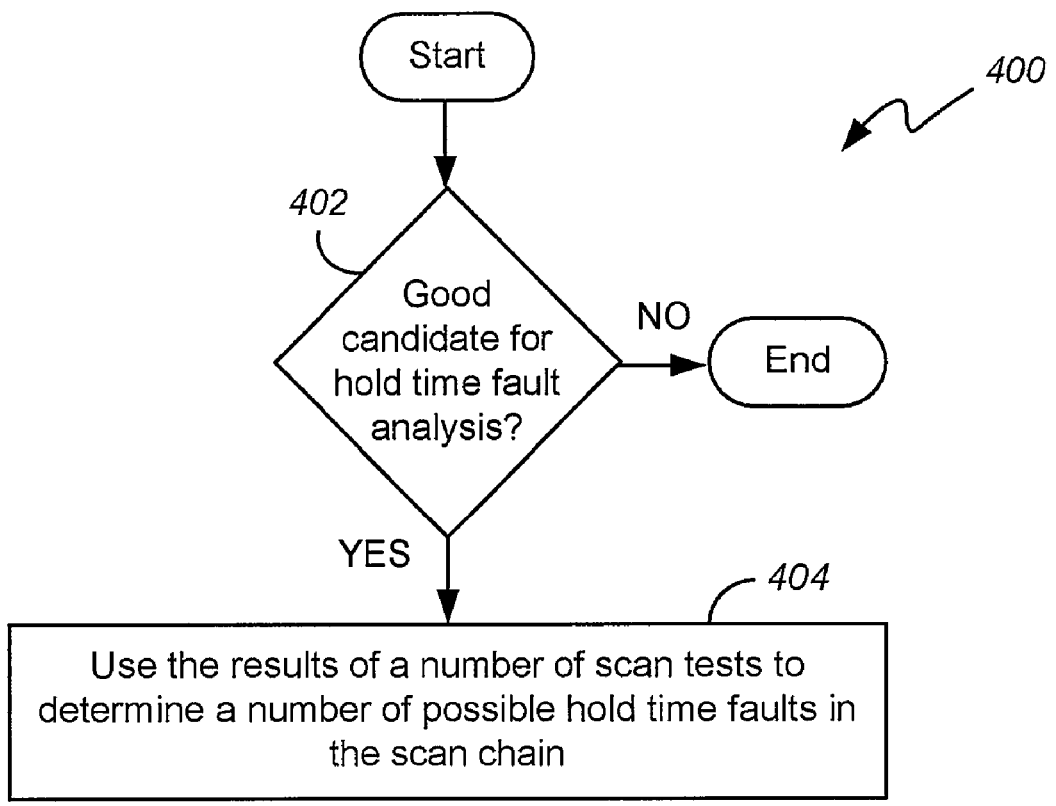
FIG. 4 illustrates a first exemplary method for determining a number of hold time faults in a scan chain.

FIG. 4 illustrates an exemplary method 400 for determining a number of possible hold time faults in a scan chain. The method 400 comprises determining whether a scan chain is a good candidate for hold time fault analysis (at block 402), and if so, using the results of a number of scan tests to determine a number of possible hold time faults in the scan chain (at block 404). Exemplary methods for determining the number of possible hold time faults will be discussed later in this description.

Figure 5:
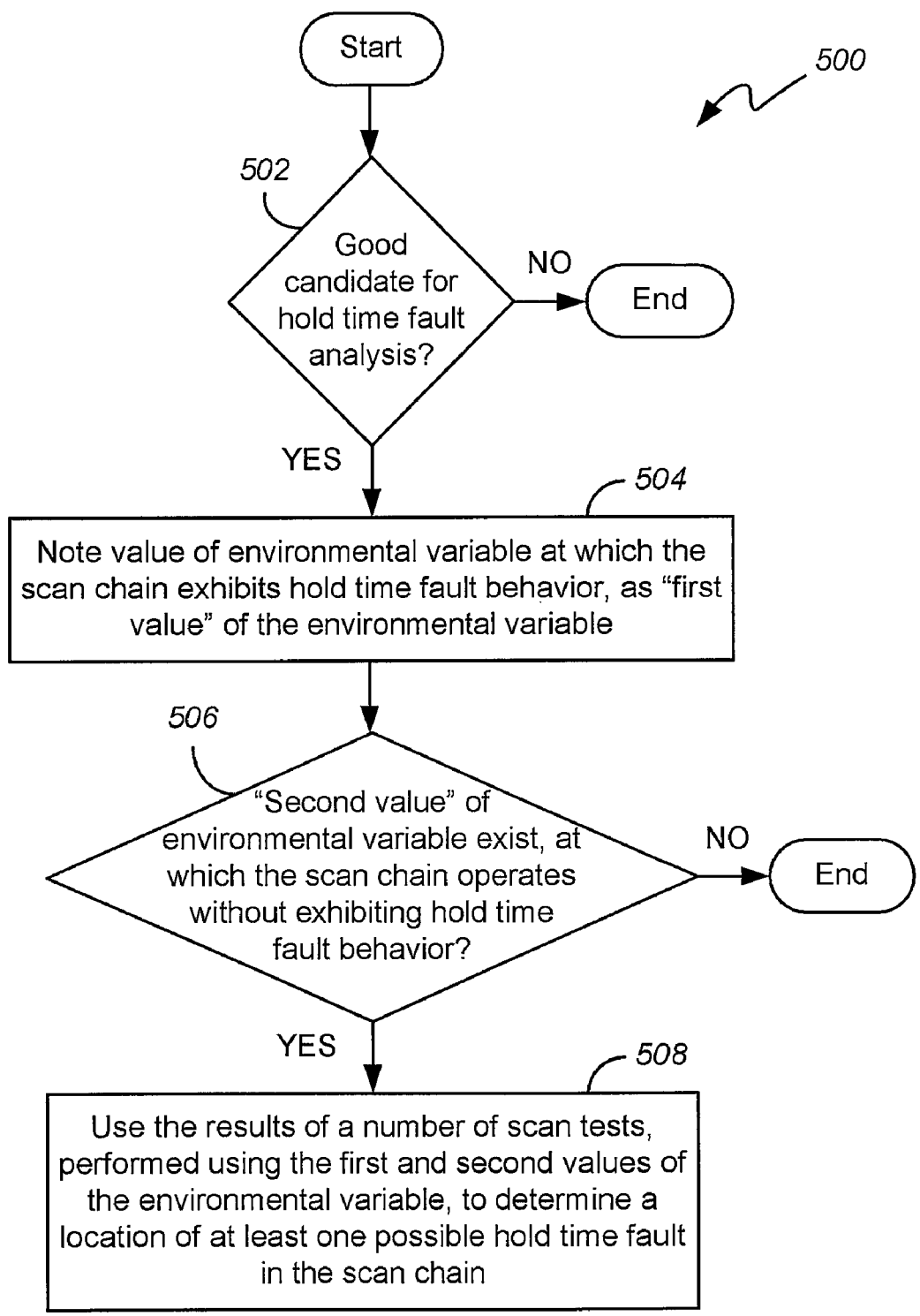
FIG. 5 illustrates a first exemplary method for determining a location of at least one hold time fault in a scan chain.

FIG. 5 illustrates an exemplary method 500 for determining a location of at least one possible hold time fault in a scan chain. The method 500 comprises determining whether a scan chain is a good candidate for hold time fault analysis (at block 502). If so, the value of an environmental variable at which the scan chain exhibited hold time fault behavior is noted (as a first value of the environmental variable (at block 504). The environmental variable is then set to one or more different values, and a determination is made as to whether there exists a second value of the environmental variable, at which the scan chain operates without exhibiting hold time fault behavior (at block 506). If it is determined that the second value exists, the results of a number of scan tests are used to determine a location of at least one possible hold time fault in the scan chain (at block 508). The number of scan tests is performed using the first and second values of the environmental variable. Exemplary methods for determining the location of at least one possible hold time fault in a scan chain will be discussed later in this description.

The environmental variable varied by the method 500 may take various forms, and may in some cases include one or more of: a supply voltage, a temperature, or a scan shift clock rate. Experimentation by the inventors has shown that, in some cases, raising or lowering the supply voltage of the scan chain (or DUT as a whole) can change the internal timings of scan chains enough to create or eliminate a hold time issue. Temperature and scan shift clock rate (CK rate in FIG. 3) can also affect the internal timings and contribute to the effective operation of a scan chain.

Figure 6:
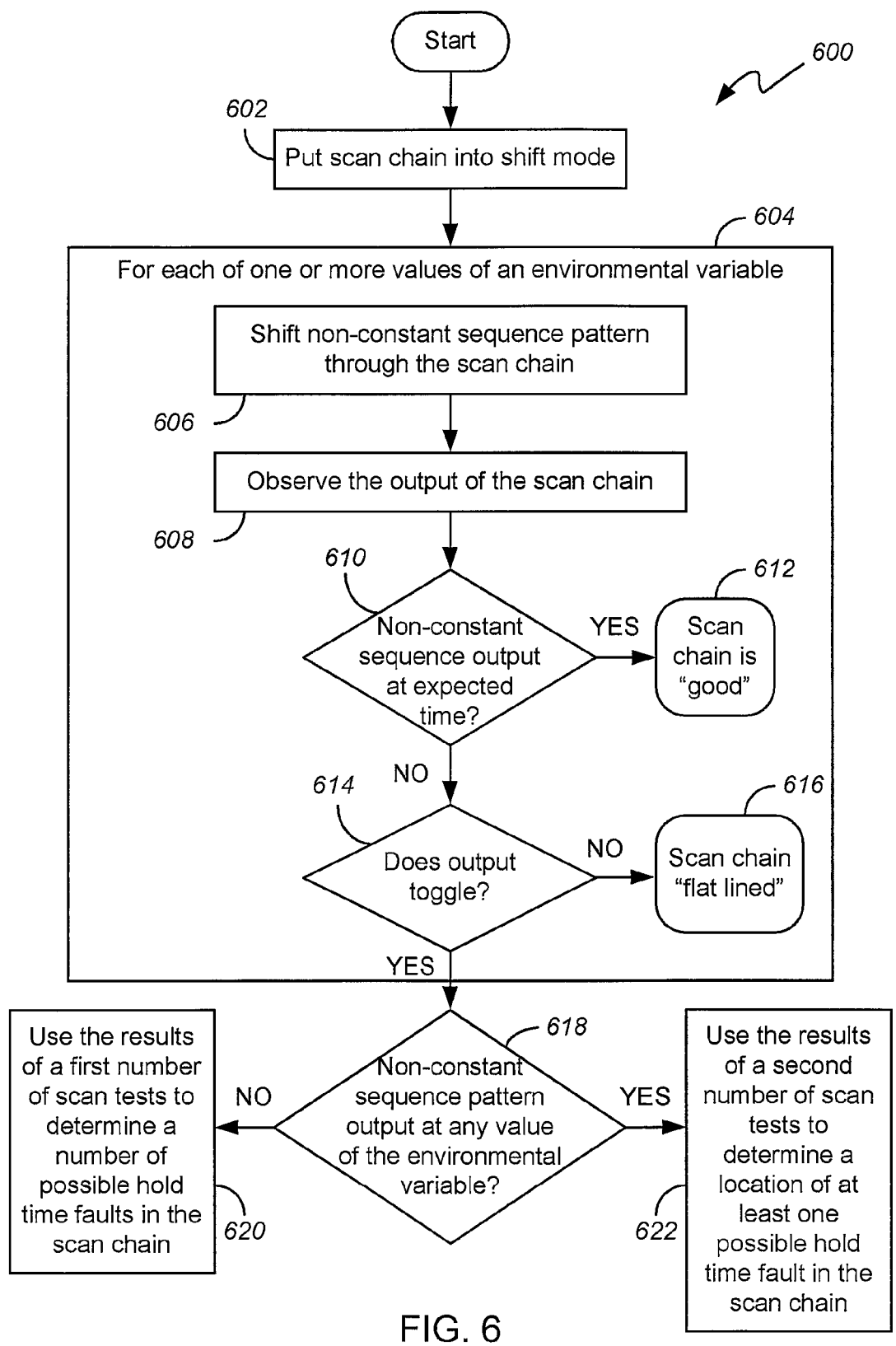
FIG. 6 illustrates a first exemplary method for analyzing a scan chain.

FIG. 6 illustrates an exemplary method 600 for combining and implementing the methods 400, 500 shown in FIGS. 4 & 5. The method 600 commences with a scan chain being put into shift mode (at block 602). Thereafter, and for each of one or more values of an environmental variable (see block 604), the method 600 iterates through a series of steps.

At block 606, a non-constant sequence pattern is shifted through the scan chain, and the output of the scan chain is observed (at block 608). A "non-constant sequence pattern" is defined herein as a pattern that comprises at least two logic states. Preferably, although not necessarily, a "non-constant sequence pattern" also comprises frequent transitions between the two or more logic states. "Non-constant" does not mean that a pattern must be free of repetitions.

At block 610, it is determined whether the non-constant sequence pattern is output from the scan chain at an expected time. If so, the scan chain was identified as "good" at a particular value of the environmental variable (at block 612). If not, the method 600 proceeds to step 614. At block 614, it is determined whether the output of the scan chain toggles. When an unexpected toggle pattern is output from the scan chain (i.e., block 614 is answered YES), the scan chain is a good candidate for hold time fault analysis. When a flat line pattern is output from the scan chain, the scan chain is identified as "flat lined" (at block 616). A "flat line pattern" is defined herein as a pattern consisting of a contiguous series of bits having a single logic state (e.g., all logic ones, or all logic zeros). A scan chain that outputs a flat line pattern, in response to a non-constant sequence pattern, is typically blocked (e.g., because of a ground short).

Hold time fault analysis begins at decision block 618 and comprises determining whether the scan chain output the non-constant sequence pattern at any value of the environmental variable. If the scan chain failed to output the non-constant sequence pattern at any value of the environmental variable, the number of possible hold time faults in the scan chain is determined based on the results of a first number of scan tests (at block 620). However, if the scan chain does output the non-constant sequence pattern, the location of at least one possible hold time fault in the scan chain is determined based on the results of a second number of scan tests (at block 622; and preferably, the locations of all hold time faults are determined). The second number of scan tests is performed using the first and second values of the environmental variable.

The steps of the methods 400, 500 and 600 are exemplary only, and various permutations of the methods 400, 500, 600 exist. In some cases, additional steps may be inserted into the methods 400, 500, 600. Also, and in the same or different cases, the order in which steps are performed may be varied.

Figure 7:
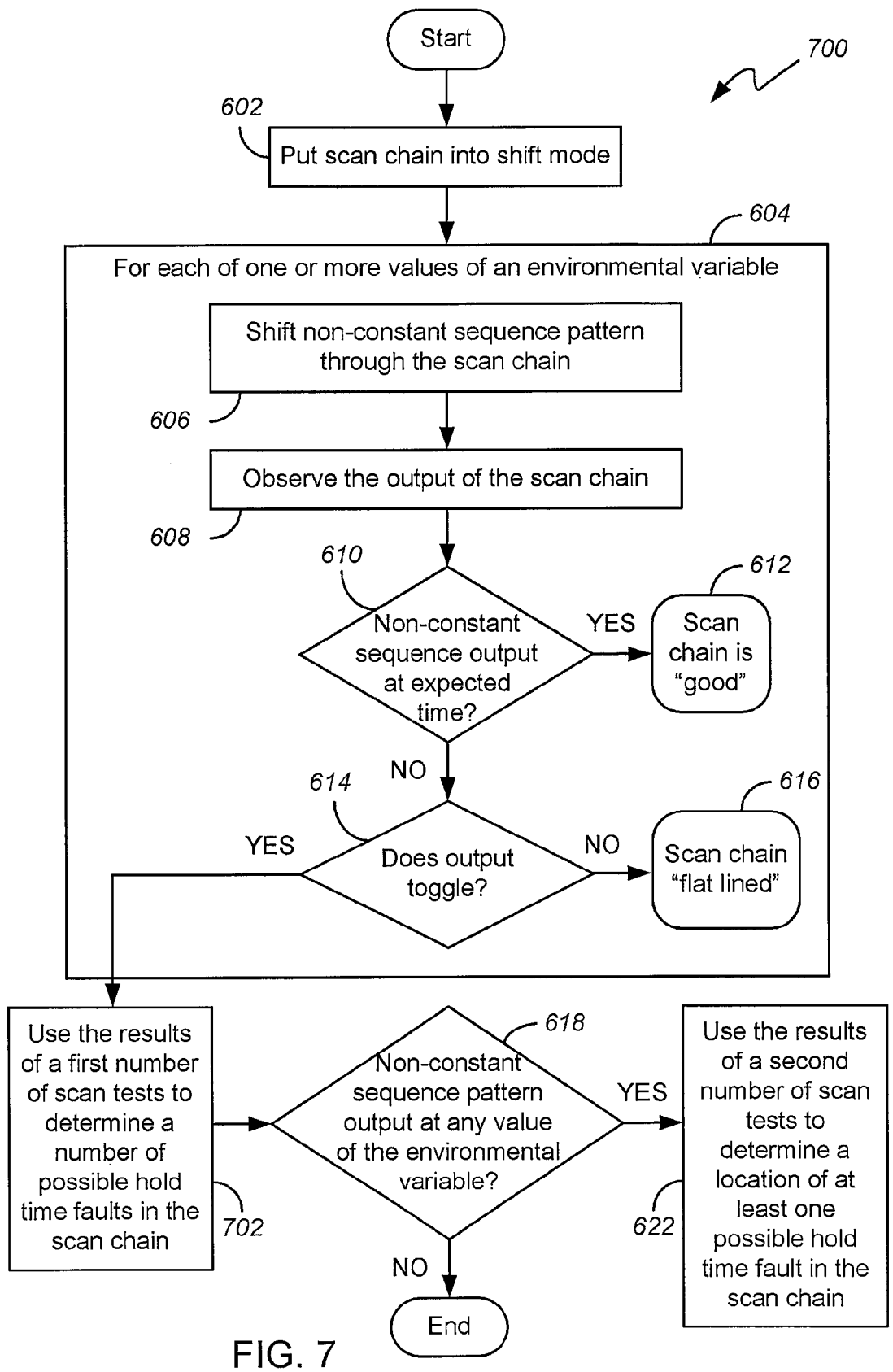
FIG. 7 illustrates a second exemplary method for analyzing a scan chain.

FIG. 7 illustrates a permutation 700 of the method 600, wherein, when the scan chain outputs an unexpected toggle pattern (and is therefore a good candidate for hold time fault analysis), the number of possible hold time faults in the scan chain is determined regardless of whether the scan chain outputs the non-constant sequence pattern at any value of the environmental variable (at block 702).

Before disclosing exemplary methods for determining the number or location of possible hold time faults, the concept of a "background pattern" will be introduced. A background pattern is a pattern of at least n contiguous bits, where n is the length of a scan chain being analyzed. Because a scan chain with possible hold time faults cannot be loaded or unloaded reliably when data is changing, and because the length of such a scan chain appears to be inconsistent, it is desirable to load a scan chain with a background pattern before loading the scan chain with an analysis pattern (i.e., a pattern for which the output of the scan chain is going to be observed). A background pattern serves to flush a scan chain of unknown data transitions. Depending on the type of analysis pattern that is to follow a background pattern, the background pattern may be, for example, at least n contiguous bits of logic ones, or alternately, n contiguous bits of logic zeros. In some cases, a background pattern may also follow an analysis pattern, to ensure that aggressor bits do not corrupt the analysis pattern.

Figure 8:
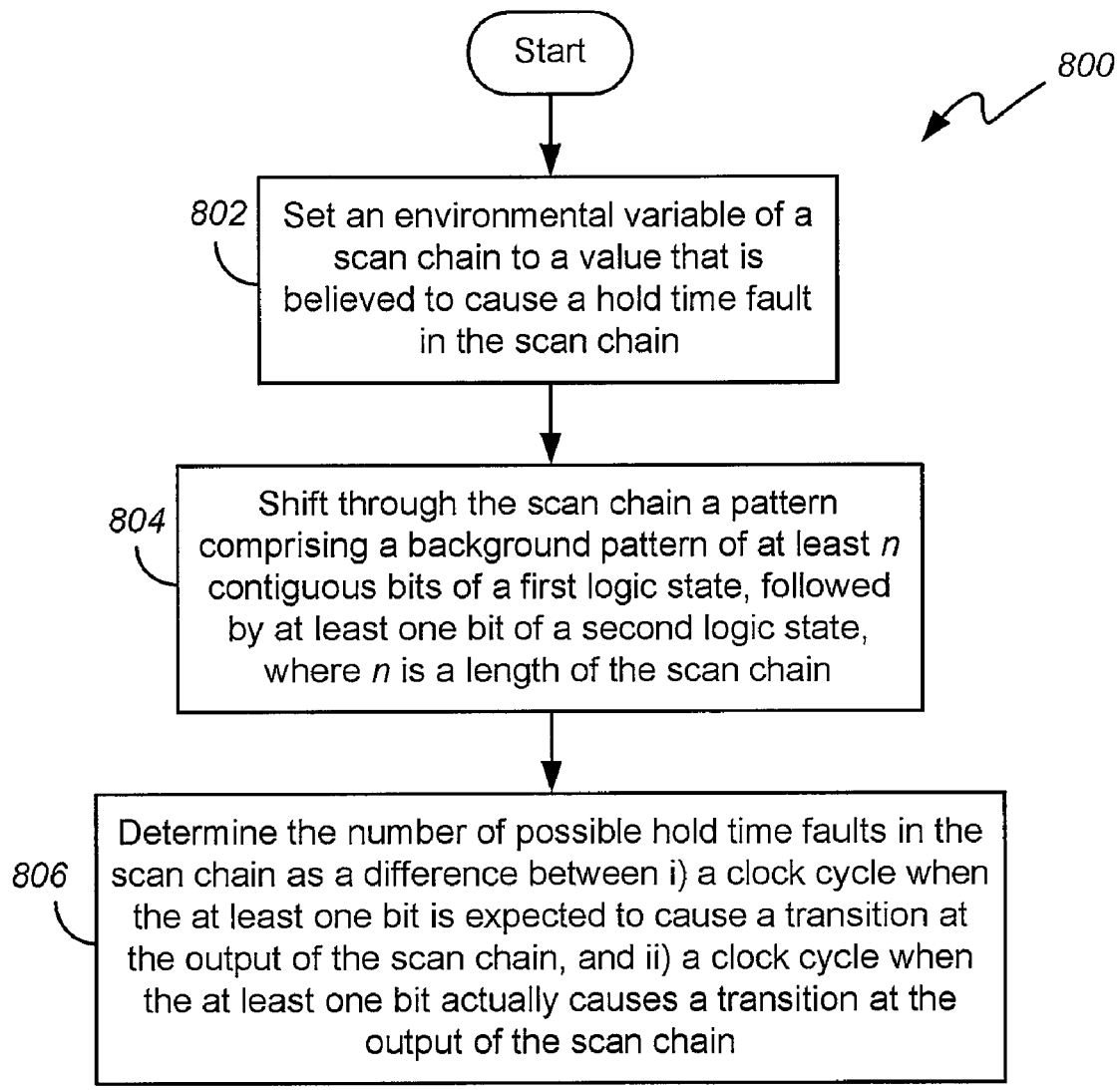
FIG. 8 illustrates a second exemplary method for determining a number of hold time faults in a scan chain.

Having discussed the concept of a background pattern, FIG. 8 illustrates an exemplary method 800 for determining a number of possible hold time faults in a scan chain. By way of example, the method 800 may be executed as a result of executing any of the methods 400, 600, 700 shown in FIG. 4, 6 or 7.

The method 800 begins with the setting of an environmental variable of a scan chain to a value that is believed to cause a hold time fault in the scan chain (at block 802). Then, a pattern is shifted through the scan chain (at block 804). The pattern comprises a background pattern of at least n contiguous bits of a first logic state, followed by at least one bit of a second logic state, where n is a length of the scan chain. While or after shifting the pattern through the scan chain, the number of possible hold time faults in the scan chain may be determined as a difference between i) a clock cycle when the at least one bit is expected to cause a transition at the output of the scan chain, and ii) a clock cycle when the at least one bit actually causes a transition at the output of the scan chain (at block 806). In other words, because a hold time fault enables data to propagate through one or more scan cells too quickly, the method 800 determines how many clock cycles "too early" the "at least one bit of the second logic state" causes a transition at the output of the scan chain. If the at least one bit of the second logic state causes a transition when expected, the scan chain may not have a hold time fault; and if the at least one bit of the second logic state causes a transition too late, the scan chain may have a fault other than a hold time fault.

Although the "at least one bit of the second logic state" which follows the background pattern of the first logic state may consist of only a single bit, it is preferable, for robustness (and compatibility with conventional scan chain loading processes) to configure the "at least one bit of the second logic state" as at least n contiguous bits of the second logic state.

The method 800, as previously described, enables a number of hold time faults of one "polarity" to be determined (e.g., a number of rising edge or logic zero-to-one faults OR a number of falling edge or logic one-to-zero faults). However, the method 800 can be expanded to enable the determination of a number of rising edge hold time faults AND a number of falling edge hold time faults. For example, in one embodiment, the pattern that is shifted through the scan chain in accord with the method 800 may comprise 2n bits of the first logic state, followed by 2n bits of the second logic state, followed by n bits of the first logic state. In this embodiment, and while or after shifting the pattern through the scan chain, the numbers of rising and falling edge hold time faults may be determined as differences between i) a clock cycle when a respective edge is expected to be output from the scan chain, and ii) a clock cycle when the respective edge is actually output from the scan chain. The pattern that is shifted through the scan is provided with an initial 2n bits of the first logic state because hold time faults in a chain can make change the "apparent" length of the scan chain, and 2n bits provide a better likelihood of a complete scan chain wash.

Before disclosing exemplary methods for determining the location of possible hold time faults, exemplary methods for determining first and second values of an environmental variable will be discussed. The first value is a value at which hold time fault behavior is observed in a scan chain, and the second value is a value at which no hold time fault behavior is observed in the scan chain.

In some cases, the first and second values of the environmental variable may be determined by simply receiving them from a user. For example, a user may provide the values by inputting them via a user interface of a computer, or by saving them in an electronic file. The user may provide the values based on suspicion or knowledge that the first value causes a scan chain to exhibit hold time fault behavior and the second value does not; or, the user may provide the values based on the first value being a "target value" (or within a normal operating range of the environmental variable for the scan chain), and based on the second value being outside a normal operating range of the environmental variable for the scan chain. Care may be taken to ensure that the second value, although outside the normal operating range of the environmental variable, is within a range that is not expected to damage the scan chain.

In other cases, the first or second value of the environmental variable may be identified using a method such as the method 600 (FIG. 6). That is, for each of a plurality of values (i.e., two or more values) of the environmental variable, the non-constant sequence pattern may be shifted through the scan chain to determine whether the non-constant sequence pattern is output from the scan chain at an expected time (at blocks 606, 608, 610, 614). The first value of the environmental variable may then be identified as one of the plurality of values (or a target value, or value within a normal operating range of the scan chain) that causes the scan chain to output an unexpected toggle pattern (at block 618). The second value of the environmental variable may then be identified as one of the plurality of values that causes the non-constant sequence pattern to be output from the scan chain at the expected time (at block 610).

In some embodiments, the steps of the method 600 within block 604 may be sequentially repeated for values of the environmental variable which begin lower than a target value and then increase. In other embodiments, the steps within block 604 may be sequentially repeated for values of the environmental variable which begin higher than a target value and then decrease. In either case, the values of the environmental variable for which the steps in block 604 are repeated may be determined by stepping (or sweeping) the value of the environmental variable in accord with a step size. The step size can be selected to provide sufficient resolution for determining whether the first and second values exist. Alternately, the values of the environmental variable may be chosen at random, or based on knowledge of what values may work.

Preferably, the steps within block 604 of method 600 are repeated more than once for each value of the environmental variable, to ensure that results are repeatable.

Another way to identify the first or second value of the environmental variable is by performing a method such as the method 800 for different values of the environmental variable. The first value may then be identified as a value that causes the scan chain output to transition prior to an expected time (or clock cycle), and the second value may be identified as a value that causes the scan chain output to transition at an expected time.

Figure 9:
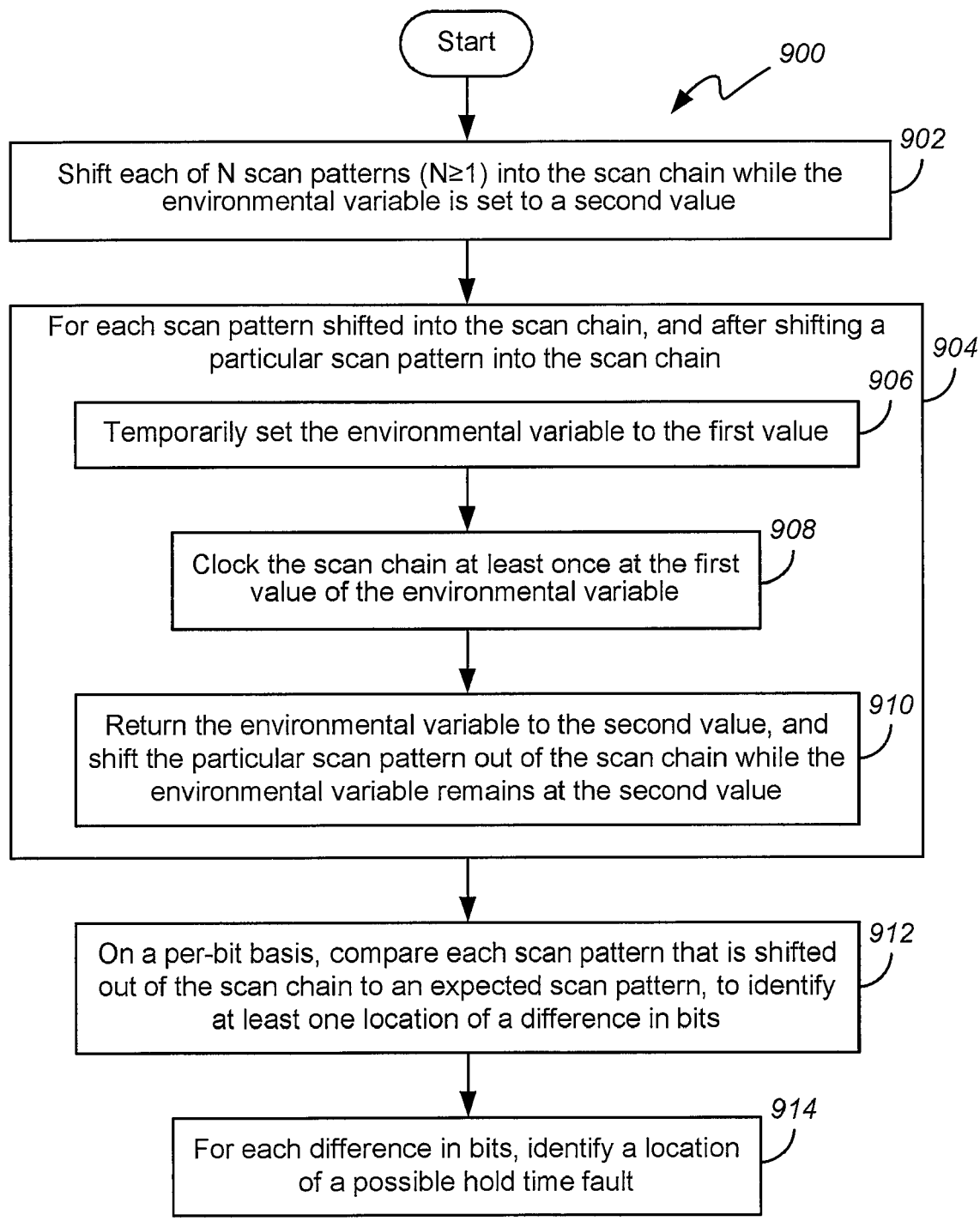
FIG. 9 illustrates a second exemplary method for determining a location of at least one hold time fault in a scan chain.

Having discussed various exemplary methods for determining appropriate first and second values of an environmental variable, reference is now made to FIG. 9, which illustrates an exemplary method 900 for determining a number of possible hold time faults in a scan chain. By way of example, the method 900 may be executed as a result of executing any of the methods 500, 600, 700 shown in FIG. 5, 6 or 7.

Execution of the method 900 presumes that an environmental variable of a scan chain can be alternately set to a first value and a second value, where the first value is believed to cause a hold time fault in the scan chain, and where the second value believed not to cause a hold time fault in the scan chain. In this context, the method 900 begins with the shifting of at least one scan pattern into the scan chain, while the environmental variable is set to the second value (at block 902, where N is the number of scan patterns to be shifted into the scan chain). For each scan pattern shifted into the scan chain, and after shifting a particular scan pattern into the scan chain (see block 904), the environmental variable is temporarily set to the first value (at block 906). The scan chain is then clocked at least once at the first value of the environmental variable (at block 908). Subsequently, the environmental variable is returned to the second value, and the particular scan pattern is shifted out of the scan chain while the environmental variable remains at the second value (at block 910). On a per-bit basis, each particular scan pattern that is shifted out of the scan chain is compared to an expected scan pattern, to identify at least one location of a difference in bits (at block 912). Each time a difference in bits is identified, a new location of a possible hold time fault is identified based on the difference (at block 914).

Because the method 900 shifts data out of the scan chain at a safe value of the environmental variable (i.e., the second value), failing bits indicate the mis-transfer of data when the scan chain is clocked at the first value of the environmental variable (i.e., clocked at a value of the environmental variable that is believed to cause a hold time fault in the scan chain). Preferably, the load of a background pattern is used to wash the scan chain of unwanted data prior to the load of each scan pattern for which the output of the scan chain is observed.

Often, the pattern or patterns that are shifted through a scan chain in accord with the method 900 can be based on a chain integrity pattern, such as a repeating 00110011 pattern.

Because the method 900 introduces at least one extra clock, when the scan chain is shifted at the first value of the environmental variable, the scan pattern(s) expected at the output of the scan chain will be reduced by at least one bit. This is due to the fact that a leading bit or bits of a loaded pattern are shifted out during the extra clock(s), and not during the normal unload process. Thus, for a scan chain of even parity, the following patterns are loaded and expected:

| Loaded pattern: | 00110011 |
| Expected pattern: | 0110011 |

Because a hold time fault can occur for some data transitions, but not others, the method 900 can be configured to ensure that each scan cell in a scan chain experiences a logic zero-to-one (0-1), logic one-to-one (1-1), logic one-to-zero (1-0) and logic zero-to-zero (0-0) transition when the scan chain is clocked at the first value of the environmental variable. In one embodiment, this is accomplished by shifting different phases of the repeating 00110011 pattern through the scan chain, and then for each phase pattern, clocking the scan chain only once at the first value of the environmental variable. More specifically, the different phases are:

| First phase: | 00110011 (i.e., hexadecimal 3's) |
| Second phase: | 01100110 (i.e., hexadecimal 6's) |
| Third phase: | 11001100 (i.e., hexadecimal C's) |
| Fourth phase: | 10011001 (i.e., hexadecimal 9's) |

The naming convention of the phases, and the order in which they are applied, is not important.

Given the above exemplary phase patterns, and an even parity scan chain, the following patterns are loaded and expected:

| First phase loaded pattern: | 00110011 |
| First phase expected pattern: | 0110011 |
| Second phase loaded pattern: | 01100110 |
| Second phase expected pattern: | 1100110 |
| Third phase loaded pattern: | 11001100 |
| Third phase expected pattern: | 1001100 |
| Fourth phase loaded pattern: | 10011001 |
| Fourth phase expected pattern: | 0011001 |

The above phase patterns are exemplary only, and other patterns can be used to ensure that each scan cell in a scan chain experiences a logic zero-to-one (0-1), logic one-to-one (1-1), logic one-to-zero (1-0) and logic zero-to-zero (0-0) transition when the scan chain is clocked at the first value of the environmental variable. By configuring the method 900 to expose a scan cell to all possible logic transitions, the method 900 enables the location(s) of all possible hold time faults to be determined, regardless of the polarity of the hold time fault(s).

Of note, the length of a repeating pattern should be greater than the number of possible hold time faults in a scan chain, to prevent copies of a repeating pattern from collapsing on themselves.

Although the speed at which locations of hold time faults are identified is usually increased by filling a scan chain with a non-constant sequence pattern, it is sometimes helpful to apply short data sequences to specific areas of a scan chain where hold time faults are expected or detected. For instance a background of zeros with a single foreground vector of 1000010000 pattern, clocked through an area of a scan chain for one or more cycles at a first (or unsafe) value of an environmental variable can sometimes detect data sensitivities.

The methods 400, 500, 600, 700, 800, 900 disclosed herein may be applied to DUT's having multiple scan chains. In such cases, multiple (or all) scan chains may be loaded in parallel with background or analysis patterns. However, it will sometimes be necessary to isolate numbers or locations of hold time faults by loading all scan chains with background patterns, and then loading only one scan chain with an analysis pattern. Also, if scan chains are of unequal length, it may be necessary to pre- or post-pad some scan chains with "don't care" bits. In these instances, it is typically desirable to make the "don't care" bits match the states of these bits to a background pattern.

When the method 500, 600, 700 or 900 is applied to a DUT having multiple scan chains, different "second values" (or safe values) of an environmental variable may be determined or used for different ones of the scan chains.

The methods 400, 500, 600, 700, 800, 900 disclosed herein may be applied to scan chains having even or odd parity. When any of these methods is applied to a scan chain having odd parity, the method 400, 500, 600, 700, 800 or 900 may account for pattern inversion when determining whether a particular pattern is output from a scan chain.

As previously discussed, the methods 400, 500, 600, 700, 800, 900 disclosed herein enable the numbers or locations of hold time faults in a scan chain to be determined. Often, this can help in determining the type or location of defects that may exist in a DUT's clock distribution system.

Depending on their implementation, the methods 400, 500, 600, 700, 800, 900 can provide various advantages. For example, the methods can be implemented as part of an adaptive process that determines numbers and/or locations of hold time faults in a generalized way, without requiring a specific test program for a specific DUT. The methods can also be configured to use conventional chain integrity or stuck-at vectors, which minimizes or eliminates the need for special-purpose vectors to diagnose hold time faults. The methods can also be configured to provide real-time analysis.

With respect to the methods 600 and 700, real-time decisions can be made, and the flow of the methods 600 and 700 can be modified based on determinations that a scan chain is "good", "flat-lined" or a good candidate for hold time fault analysis. When a scan chain is deemed to be a good candidate for hold time fault analysis, different types of analyses can be initiated, depending on whether the scan chain operates correctly at a value of an environmental variable that differs from a target value.

The methods 400, 500, 600, 700, 800 and 900 can also provide the numbers and/or locations of both rising edge and falling edge hold time faults, which can help to determine the source of such faults.

In some embodiments, one or more of the methods 400, 500, 600, 700, 800 and 900 can be automatically launched upon failure of a chain integrity test, or after other notification that a scan chain error may exist.

The methods 400, 500, 600, 700, 800 and 900 disclosed herein may be implemented in various ways, and in some embodiments may be implemented primarily by software or firmware, which software or firmware may include instructions that, when executed by a computer or test system, cause a sequence of scan patterns to be applied to, and read from, the scan input(s) and scan output(s) of one or more scan chains. The software or firmware may also include instructions that control other variables of scan testing, such as the value of scan enable (SE) and scan clock (CK) inputs, as well as the value(s) of one or more environmental variables for the scan chain(s). The software or firmware may be stored on computer-readable media. The computer-readable media may include, for example, any number or mixture of fixed or removable media (such as one or more fixed disks, random access memories (RAMs), read-only memories (ROMs), or compact discs), at either a single location or distributed over a network. The computer-readable media may also include programmed circuitry, such as a field-programmable gate array (FPGA).

The methods 400, 500, 600, 700, 800 and 900 may also be implemented using hardware, such as hardware that compares scan patterns as they are read from (or supplied to, in the case of an expected pattern) the scan output of a scan chain.

Furthermore, and by way of example, hardware-based counters may be used to determine how many clock cycles a scan pattern causes an "early" or "late" transition at a scan output. Hardware employed by the methods 500, 600, 700 and 900 may also include a pattern controlled power supply that can be switched between first and second voltages under pattern control.

In some cases, the numbers or locations of hold time faults obtained by executing the methods 400, 500, 600, 700, 800 and 900 may be saved to a file (such as an STDF file) and later read or interpreted by a user or downstream analysis software. Alternately, the data derived from the methods 400, 500, 600, 700, 800 and 900 may be immediately displayed in a textual or graphical format. For example, the number or locations of faults could be displayed textually, or the locations of faults could be mapped to displayed images of affected scan cells.

What is claimed is:

1. A method for analyzing a scan chain of a device under test, comprising:
    setting an environmental variable of the scan chain to a first value, and then shifting a non-constant sequence pattern through the scan chain to determine whether an unexpected toggle pattern is output from the scan chain;
    setting the environmental variable to a second value, and then shifting the non-constant sequence pattern through the scan chain to determine whether the non-constant sequence pattern is output from the scan chain at an expected time; and
    at least when the scan chain both i) outputs the unexpected toggle pattern at the first value of the environmental variable, and ii) fails to output the non-constant sequence pattern at the second value of the environmental variable, at the expected time, determining a number of possible hold time faults in the scan chain based on results of a first number of scan tests.

2. The method of claim 1, further comprising, when the scan chain both i) outputs the unexpected toggle pattern at the first value of the environmental variable, and ii) outputs the non-constant sequence pattern at the second value of the environmental variable, at the expected time, determining a location of at least one possible hold time fault in the scan chain based on results of a second number of scan tests, wherein the second number of scan tests are performed using the first and second values of the environmental variable.

3. The method of claim 2, wherein determining the location of at least one possible hold time fault in the scan chain comprises:
    shifting at least one scan pattern into the scan chain while the environmental variable is set to the second value;
    for each of the at least one scan pattern shifted into the scan chain, and after shifting a particular scan pattern into the scan chain,
        temporarily setting the environmental variable to the first value; and then
        clocking the scan chain at least once; and then
        shifting the particular scan pattern out of the scan chain while the environmental variable is set to the second value;
    on a per-bit basis, comparing each particular scan pattern shifted out of the scan chain to an expected scan pattern, to identify at least one location of a difference in bits; and
    determining, based on the at least one location of the difference in bits, the location of the at least one possible hold time fault in the scan chain.

4. The method of claim 3, wherein shifting at least one scan pattern into the scan chain, when determining the location of at least one possible hold time fault in the scan chain, comprises:
   shifting a plurality of scan patterns into the scan chain, the plurality of scan patterns having sequences of bits that ensure each scan cell's experience of a logic zero-to-one, logic one-to-one, logic one-to-zero and logic zero-to-zero transition when the scan chain is clocked at the first value of the environmental variable, thereby enabling the location(s) of all possible hold time faults to be determined, regardless of polarity of the hold time fault(s).

5. The method of claim 4, wherein the plurality of scan patterns comprise patterns of repeating hexadecimal 3's, 6's, C's and 9's.

6. The method of claim 3, wherein clocking the scan chain at least once consists of clocking the scan chain only once.

7. The method of claim 1, further comprising, when the scan chain both i) outputs the unexpected toggle pattern at the first value of the environmental variable, and ii) outputs the non-constant sequence pattern at the second value of the environmental variable, determining a possible number of hold time faults in the scan chain based on results of a first number of scan tests.

8. The method of claim 1, further comprising, after stilling the non-constant sequence pattern through the scan chain at the first value of the environmental variable, i) identifying the scan chain as "good" when an expected pattern is output from the scan chain, and ii) identifying the scan chain as "flat-lined" when a flat-line pattern is output from the scan chain.

9. The method of claim 8, further comprising, only setting the environmental variable to the second value when the scan chain outputs an unexpected toggle pattern at the first value of the environmental variable.

10. The method of claim 1, further comprising, receiving the first and second values of the environmental value from a user.

11. The method of claim 1 further comprising, identifying the second value of the environmental variable by:
   for each of a plurality of values of the environmental variable, shifting the non-constant sequence pattern through the scan chain to determine whether the non-constant sequence pattern is output from the scan chain at an expected time; and
   identifying the second value of the environmental variable as one of the plurality of values that causes the non-constant sequence pattern to be output from the scan chain at the expected time.

12. The method of claim 1, wherein the first value is within a normal operating range of the environmental variable for the scan chain, and wherein the second value is outside a normal operating range of the environmental variable for the scan chain.

13. The method of claim 1, wherein determining the number of hold time faults in the scan chain comprises:
   setting the environmental variable to the first value; and then
   shifting through the scan chain a background pattern of at least n contiguous bits of a first logic state, followed by at least one bit of a second logic state; and
   determining the number of possible hold time faults in the scan chain as a difference between i) a clock cycle when the at least one bit is expected to cause a transition at an output of the scan chain, and ii) a clock cycle when the at least one bit actually causes a transition at the output of the scan chain.

14. The method of claim 1, wherein determining the number of hold time faults in the scan chain comprises:
   setting the environmental variable to the first value; and then
   shifting through the scan chain a pattern of 2n bits of a first logic state, followed by 2n bits of a second logic state, followed by n bits of the first logic state, where n is the number of scan cells in the scan chain; and
   determining a number of rising edge hold time faults, and a number of falling edge hold time faults, as differences between i) a clock cycle when a respective edge is expected to be output from the scan chain, and ii) a clock cycle when the respective edge is actually output from the scan chain.

15. The method of claim 1, wherein, if the scan chain has odd parity, determining whether a particular pattern is output from the scan chain comprises accounting for pattern inversion.

16. The method of claim 1, wherein the environmental variable is a supply voltage.

17. The method of claim 1, wherein the environmental variable is a temperature.

18. The method of claim 1, wherein the environmental variable is a scan shift clock rate.

19. A method for analyzing a scan chain of a device under test, comprising:
   setting an environmental variable of the scan chain to a first value, and then shifting a non-constant sequence pattern through the scan chain to determine whether an unexpected toggle pattern is output from the scan chain;
   setting the environmental variable to a second value, and then shifting the non-constant sequence pattern through the scan chain to determine whether the non-constant sequence pattern is output from the scan chain at an expected time; and
   when the scan chain both i) outputs the unexpected toggle pattern at the first value of the environmental variable, and ii) outputs the non-constant sequence pattern at the second value of the environmental variable, at the expected time, determining a location of at least one possible hold time fault in the scan chain based on results of a number of scan tests, wherein the second number of scan tests are performed using the first and second values of the environmental variable.

20. The method of claim 19, wherein the environmental variable is a supply voltage.

21. A method for determining a number of possible hold time faults in a scan chain of a device under test, comprising:
   setting an environmental variable of the scan chain to a value believed to cause a hold time fault in the scan chain; and then
   shifting a pattern through the scan chain, the pattern having a background pattern of at least n contiguous bits of a first logic state, followed by at least one bit of a second logic state, where n is a length of the scan chain; and
   determining the number of possible hold time faults in the scan chain as a difference between i) a clock cycle when the at least one bit is expected to cause a transition at an output of the scan chain, and ii) a clock cycle when the at least one bit actually causes a transition at the output of the scan chain.

22. The method of claim 21, wherein:
   the pattern shifted through the scan chain comprises 2n bits of the first logic state, followed by 2n bits of the second logic state, followed by n bits of the first logic state; and
   determining the number of hold time faults in the scan chain comprises determining a number of rising edge hold time faults, and a number of falling edge hold time faults, as differences between i) a clock cycle when a respective edge is expected to be output from the scan chain, and ii) a clock cycle when the respective edge is actually output from the scan chain.

23. The method of claim 21, wherein the environmental variable is a supply voltage.

* * * * *

UNITED STATES PATENT AND TRADEMARK OFFICE
CERTIFICATE OF CORRECTION

PATENT NO. : 8,010,856 B2
APPLICATION NO. : 12/058768
DATED : August 30, 2011
INVENTOR(S) : Stephen A. Cannon et al.

It is certified that error appears in the above-identified patent and that said Letters Patent is hereby corrected as shown below:

In the Background, column 1, line 42, "LLSD approach" should read --LSSD approach--.

In the Background, column 1, line 52, "MUXE type scan," should read --MUXD type scan,--.

Column 13, line 26, "after stilling" should read --after shifting--.

Signed and Sealed this
Twentieth Day of December, 2011

David J. Kappos
*Director of the United States Patent and Trademark Office*